(12) United States Patent
Ellavsky et al.

(10) Patent No.: US 8,271,912 B2
(45) Date of Patent: Sep. 18, 2012

(54) RADIATION TOLERANCE BY CLOCK SIGNAL INTERLEAVING

(75) Inventors: Matthew R. Ellavsky, Rochester, MN (US); AJ KleinOsowski, Austin, TX (US); Scott M. Willenborg, Stewartville, MN (US)

(73) Assignee: International Business Machines Corporation, Armonk, NY (US)

( * ) Notice: Subject to any disclaimer, the term of this patent is extended or adjusted under 35 U.S.C. 154(b) by 627 days.

(21) Appl. No.: 12/051,002

(22) Filed: Mar. 19, 2008

(65) Prior Publication Data

US 2009/0241073 A1   Sep. 24, 2009

(51) Int. Cl.
*G06F 17/50* (2006.01)

(52) U.S. Cl. ..................................... 716/101
(58) Field of Classification Search .................. 716/1, 2, 716/6, 100, 101
See application file for complete search history.

(56) References Cited

U.S. PATENT DOCUMENTS

| | | | | |
|---|---|---|---|---|
| 6,127,864 A * | 10/2000 | Mavis et al. | ................ | 327/144 |
| 6,536,024 B1 * | 3/2003 | Hathaway | ................ | 327/295 |
| 6,651,230 B2 * | 11/2003 | Cohn et al. | ................ | 716/113 |
| 7,620,883 B1 * | 11/2009 | Carmichael et al. | .......... | 714/797 |
| 2002/0066065 A1 * | 5/2002 | Baumgartner et al. | .......... | 716/6 |
| 2004/0216066 A1 * | 10/2004 | Chaudhari | ................ | 716/8 |
| 2005/0036259 A1 * | 2/2005 | Hokenmaier | ................ | 361/104 |
| 2006/0090099 A1 * | 4/2006 | Martin et al. | ................ | 714/11 |
| 2007/0168786 A1 * | 7/2007 | Drake et al. | ................ | 714/724 |
| 2007/0300193 A1 * | 12/2007 | Lillis et al. | ................ | 716/3 |
| 2008/0118023 A1 * | 5/2008 | Besson | ................ | 378/8 |
| 2008/0270862 A1 * | 10/2008 | Drake et al. | ................ | 714/731 |
| 2009/0037798 A1 * | 2/2009 | Drake et al. | ................ | 714/797 |
| 2009/0085627 A1 * | 4/2009 | Gill et al. | ................ | 327/214 |
| 2009/0174455 A1 * | 7/2009 | Dimitriu et al. | ................ | 327/295 |
| 2009/0219752 A1 * | 9/2009 | Wissel | ................ | 365/154 |

* cited by examiner

*Primary Examiner* — Suchin Parihar
(74) *Attorney, Agent, or Firm* — Libby Z. Toub; Jack V. Musgrove (57) ABSTRACT

A method for designing integrated circuits uses clock signal interleaving to reduce the likelihood of a soft error arising from an upset in a clock distribution network. At least two circuits in a circuit description are identified as being sensitive to radiation, and different clock distribution nodes are assigned to the two circuits. Several exemplary implementations are disclosed. The second circuit may be a redundant replica of the first circuit, such as a reset circuit. The first and second circuits may be components of a modular redundant circuit such as a triple modular redundancy flip-flop. The first circuit may include a set of data bits for an entry of a storage array such as a register or memory array, and the second circuit may include a set of check bits associated with the entry.

19 Claims, 7 Drawing Sheets

RADIATION TOLERANCE BY CLOCK SIGNAL INTERLEAVING

BACKGROUND OF THE INVENTION

1. Field of the Invention

The present invention generally relates to the fabrication and design of semiconductor chips and integrated circuits, and more particularly to a method of designing the netlist connections of latches and other logic cells to improve radiation tolerance.

2. Description of the Related Art

Integrated circuits are used for a wide variety of electronic applications, from simple devices such as wristwatches to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files in an intermediate form that describe the layout. The design files are then converted into pattern generator files that are used to produce patterns called masks by an optical or electron beam pattern generator. During fabrication, these masks are used to pattern a silicon wafer using a sequence of photolithographic steps. The process of converting the specifications of a circuit into a layout is called the physical design.

Cell placement in semiconductor fabrication involves a determination of where particular cells should optimally (or near-optimally) be located on the surface of a integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA) including Verilog, VHDL and TDML. A typical EDA system receives one or more high level behavioral descriptions of an IC device, and translates this high level design language description into netlists of various levels of abstraction.

Placement algorithms are typically based on either a simulated annealing, top-down cut-based partitioning, or analytical paradigm (or some combination thereof). Analytical placers optimally solve a relaxed placement formulation, for example, minimizing total quadratic wire length. Placers can use other techniques to optimize circuit characteristics such as timing and power. One method involves the use of local clock buffers (LCBS) or clock splitters to distribute the clock signals. A typical clock control system has a clock generation circuit (e.g., a phase-lock loop) that generates a master clock signal which is fed to a clock distribution network that renders synchronized global clock signals at the LCBs. Each LCB adjusts the global clock duty cycle and edges to meet the requirements of respective circuit elements, such as local logic circuits or latches (the term "latch" as used herein stands for any clocked element, which is often a sink of a network). Clock splitters may be used to produce multiple clock signals having different phases.

Since clock networks can be one of the largest power consumers among all of the interconnects, it is further beneficial to control the capacitive load of the LCBs, each of which is driving a set of many clock sinks. One approach for reducing the capacitive load is latch clustering, i.e., clusters of latches placed near the respective LCB of their clock domain. Latch clustering combined with LCBs can significantly reduce the total clock wire capacitance which in turn reduces overall clock power consumption. Since most of the latches are placed close to an LCB, clock skew is also reduced which helps improve the timing of the circuit.

While these techniques provide adequate placement of cells with regard to their data interconnections, power and timing, there is an additional challenge for the designer in constructing a circuit that is resistant to soft errors, and this challenge is becoming more difficult with the latest technologies like 65-nanometer application-specific integrated circuits (ASICs). Soft errors are caused by, e.g., alpha particle strikes emitted from packaging materials or by neutrons originating from cosmic radiation. The soft-error rate (SER) of a data processing system can exceed the combined failure rate of all hard-reliability mechanisms (gate oxide breakdown, electro-migration, etc.). Radiation tolerance has thus become a necessity for meeting robustness targets in advanced systems. All storage elements (random-access memory, latches, etc.) are highly susceptible to soft-error induced failures, but memory arrays are usually protected by error-correction codes while latches are usually not so protected. Soft errors in ASIC logic book latches can accordingly be a major contributor to overall system SER.

Information stored in latches may include control, status or mode bits. For example, a data processing system might provide different mode configurations for clock control logic, and clock control latches can account for a significant portion of an ASIC latch count. These clock buffer modes are set at system power-on and often must maintain their logical value for days or months to ensure proper performance of the local logic circuits. However, the values can be upset during operation due to soft errors. An upset may be correctable by scanning in a new value, but systems may only allow input scanning in a limited manner such as at power-on, meaning that the system must be restarted if a clock control latch becomes incorrectly set. These reliability problems are particularly troublesome for harsher operating environments, such as aerospace systems where there is increased radiation (high-altitude or orbital space). Design parameters used to optimize circuits for terrestrial applications can actually be detrimental to radiation tolerance. Placers which try to minimize area will place many critical components closer to one another, making it more likely that a particle strike will cause multiple upsets.

Even if ASIC logic book data nets are hardened, upsets in the clock trees may still lead to logical upsets in the books, e.g., when an incorrect data value is captured at a latch due to a faulty clock signal. To make matters worse, ASIC logic books are designed with a single clock input. This clock input is shared among several ASIC logic books, so an upset in the clock signal can lead to multiple latches sampling incorrect data. It would, therefore, be desirable to devise an improved netlisting method which could take into account possible soft errors arising in the clock trees for critical components. It would be further advantageous if the method could be used in conjunction with existing EDA tools which provide other optimizations such as area, power and timing.

SUMMARY OF THE INVENTION

It is therefore one object of the present invention to provide a logic structure for an integrated circuit having increased radiation tolerance.

It is another object of the present invention to provide such a logic structure which reduces soft errors arising from upsets in the clock distribution network.

It is yet another object of the present invention to provide such a logic structure which does not excessively increase requirements such as area or overhead for the clock distribution network.

The foregoing objects are achieved in a method for designing an integrated circuit by receiving a circuit description which includes a plurality of circuits having a common clock domain, identifying at least two of the circuits for which radiation tolerance is desired, assigning a first one of the at least two circuits to a first clock distribution node of the common clock domain, and assigning a second one of the at least two circuits to a second clock distribution node of the common clock domain. The circuit description may be optimized for a logical-to-physical translation so a check is made to determine whether the optimization has assigned the first and second circuits to a common clock distribution node, in which case the first circuit is reassigned to the first clock distribution node and the second circuit is reassigned to the second clock distribution node. Several exemplary implementations are disclosed. The second circuit may be a redundant replica of the first circuit, such as a reset circuit. The first and second circuits may be components of a modular redundant circuit such as a triple modular redundancy flip-flop. The first circuit may include a set of data bits for an entry of a storage array such as a register or memory array, and the second circuit may include a set of check bits associated with the entry.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
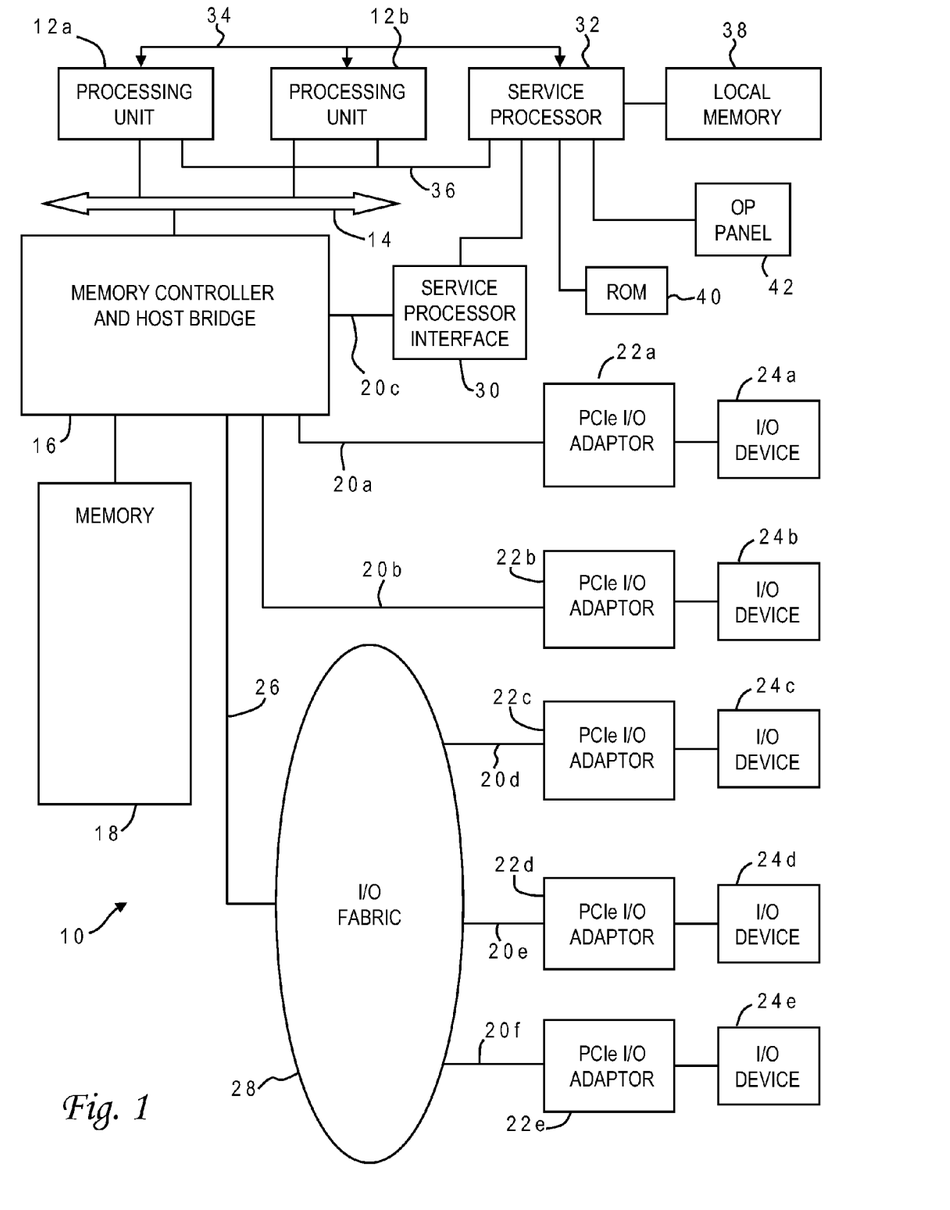
FIG. 1 is a block diagram of a computer system programmed to carry out computer-aided design of an integrated circuit in accordance with one implementation of the present invention.

With reference now to the figures, and in particular with reference to FIG. 1, there is depicted one embodiment 10 of a computer system in which the present invention may be implemented to carry out the design of logic structures in an integrated circuit. Computer system 10 is a symmetric multiprocessor (SMP) system having a plurality of processors 12a, 12b connected to a system bus 14. System bus 14 is further connected to a combined memory controller/host bridge (MC/HB) 16 which provides an interface to system memory 18. System memory 18 may be a local memory device or alternatively may include a plurality of distributed memory devices, preferably dynamic random-access memory (DRAM). There may be additional structures in the memory hierarchy which are not depicted, such as on-board (L1) and second-level (L2) or third-level (L3) caches.

MC/HB 16 also has an interface to peripheral component interconnect (PCI) Express links 20a, 20b, 20c. Each PCI Express (PCIe) link 20a, 20b is connected to a respective PCIe adaptor 22a, 22b, and each PCIe adaptor 22a, 22b is connected to a respective input/output (I/O) device 24a, 24b. MC/HB 16 may additionally have an interface to an I/O bus 26 which is connected to a switch (I/O fabric) 28. Switch 28 provides a fan-out for the I/O bus to a plurality of PCI links 20d, 20e, 20f. These PCI links are connected to more PCIe adaptors 22c, 22d, 22e which in turn support more I/O devices 24c, 24d, 24e. The I/O devices may include, without limitation, a keyboard, a graphical pointing device (mouse), a microphone, a display device, speakers, a permanent storage device (hard disk drive) or an array of such storage devices, an optical disk drive, and a network card. Each PCIe adaptor provides an interface between the PCI link and the respective I/O device. MC/HB 16 provides a low latency path through which processors 12a, 12b may access PCI devices mapped anywhere within bus memory or I/O address spaces. MC/HB 16 further provides a high bandwidth path to allow the PCI devices to access memory 18. Switch 28 may provide peer-to-peer communications between different endpoints and this data traffic does not need to be forwarded to MC/HB 16 if it does not involve cache-coherent memory transfers. Switch 28 is shown as a separate logical component but it could be integrated into MC/HB 16.

In this embodiment, PCI link 20c connects MC/HB 16 to a service processor interface 30 to allow communications between I/O device 24a and a service processor 32. Service processor 32 is connected to processors 12a, 12b via a JTAG interface 34, and uses an attention line 36 which interrupts the operation of processors 12a, 12b. Service processor 32 may have its own local memory 38, and is connected to read-only memory (ROM) 40 which stores various program instructions for system startup. Service processor 32 may also have access to a hardware operator panel 42 to provide system status and diagnostic information.

In alternative embodiments computer system 10 may include modifications of these hardware components or their interconnections, or additional components, so the depicted example should not be construed as implying any architectural limitations with respect to the present invention.

When computer system 10 is initially powered up, service processor 32 uses JTAG interface 34 to interrogate the system (host) processors 12a, 12b and MC/HB 16. After completing the interrogation, service processor 32 acquires an inventory and topology for computer system 10. Service processor 32 then executes various tests such as built-in-self-tests (BISTs), basic assurance tests (BATs), and memory tests on the components of computer system 10. Any error information for failures detected during the testing is reported by service processor 32 to operator panel 42. If a valid configuration of system resources is still possible after taking out any components found to be faulty during the testing then computer system 10 is allowed to proceed. Executable code is loaded into memory 18 and service processor 32 releases host processors 12a, 12b for execution of the program code, e.g., an operating system (OS) which is used to launch applications, and in particular the circuit design application of the present invention, results of which may be stored in a hard disk drive of the system (an I/O device 24).

While the illustrative implementation provides program instructions embodying the present invention on disk drive 24, those skilled in the art will appreciate that the invention can be embodied in a program product utilizing other computer-readable storage media excluding transitory media such as propagating signals. The program instructions may be written in the C++ programming language for an AIX environment. Computer system 10 carries out program instructions for a circuit design process that uses novel clock leaf assignment techniques to reduce the likelihood of a soft error arising from an upset in the clock distribution network. Accordingly, a program embodying the invention may include conventional aspects of various placement and design tools, and these details will become apparent to those skilled in the art upon reference to this disclosure.

The present invention uses clock signal interleaving to enhance radiation tolerance in a wide variety of circuit designs, and is particularly useful in the design of application-specific integrated circuit (ASIC) logic books. A clock distribution network for an integrated circuit includes a clock signal source and one or more distribution structures such as clock splitters or local clock buffers (LCBs). The clock distribution network terminates at clock distribution nodes referred to herein as clock leaves, i.e., a clock leaf is the last placeable object along a branch of the clock network that provides a clock signal to one or more sinks. The method of the present invention receives a circuit description which includes circuits in a common clock domain with distinct clock signal terminations at multiple clock distribution nodes of the common clock domain, identifies sensitive circuits for which radiation tolerance is desired, and then selectively assigns different clock leaves to those circuits or components of those circuits. The use of different clock leaves for sensitive circuits greatly reduces the likelihood that any upset in the clock network will adversely affect multiple sinks.

Figure 2:
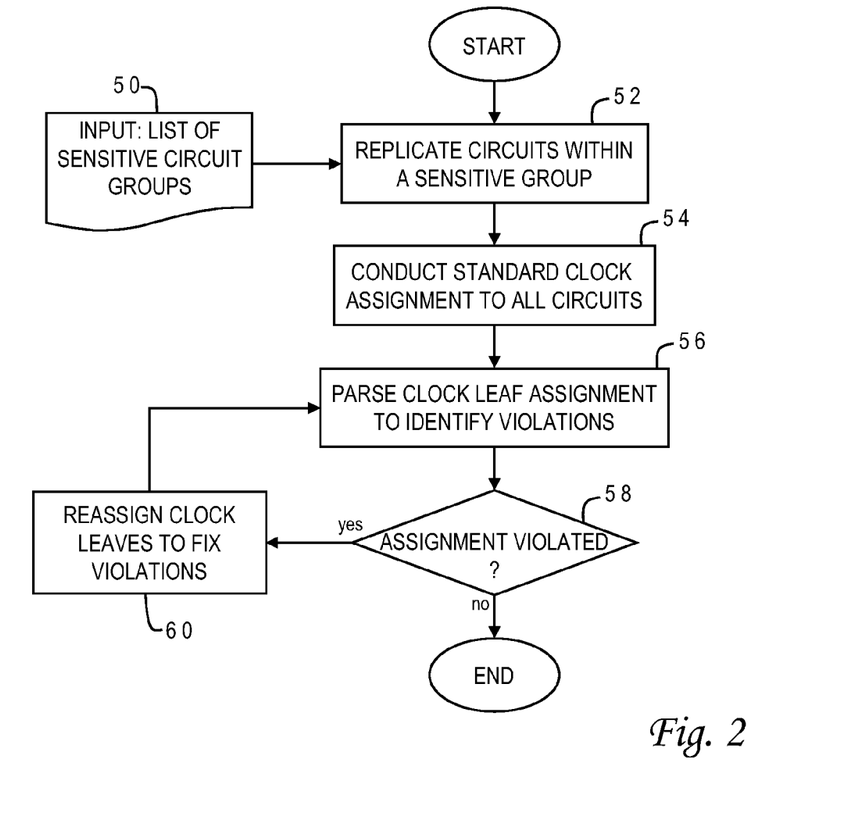
FIG. 2 is a flow chart showing the replication of sensitive circuits and assignment of different clock leaves to the replicated circuits to provide enhanced radiation tolerance in accordance with one implementation of the present invention.

Three exemplary implementations of the invention are described with reference to FIGS. 2-7, any of which may be carried out using computer system 10. The first of these implementations is directed to replicated circuits which may be considered sensitive or critical for reliability purposes. As seen in FIG. 2, this design process begins with a list of sensitive circuits or circuit groups (50). Sensitive components may include, by way of example and without limitation, redundant structures such as triplicated latches, configuration flip-flops that provide clock control, long dwell-time bits, or a reset bit used to reboot a data processing system. These components may be designated as sensitive to radiation by automatically flagging the structures as they are inserted into the netlist using an EDA tool. Circuits within a sensitive group are replicated (52), and standard clock assignment is conducted for all of the circuits including the replicated circuits (54). Clock leaf assignments are then parsed to identify any violations for radiation tolerance purposes (56). For example, a violation may be defined as circuits within a common sensitive group which are found to share a clock leaf. A check is made to see whether any clock leaf assignments are violations (58) and, if so, the clock leaves for the corresponding circuits are reassigned to fix the violation(s) (60). Once there are no more violations the process ends.

Figure 3A:
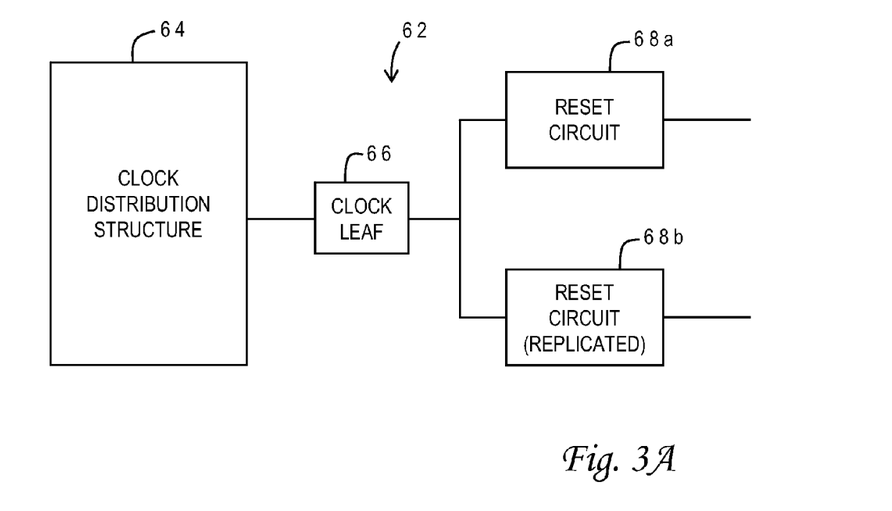
FIGS. 3A and 3B are high-level schematic diagrams illustrating one example of replicated circuits having clock leaf assignments in accordance with the implementation of FIG. 2.
Figure 3B:
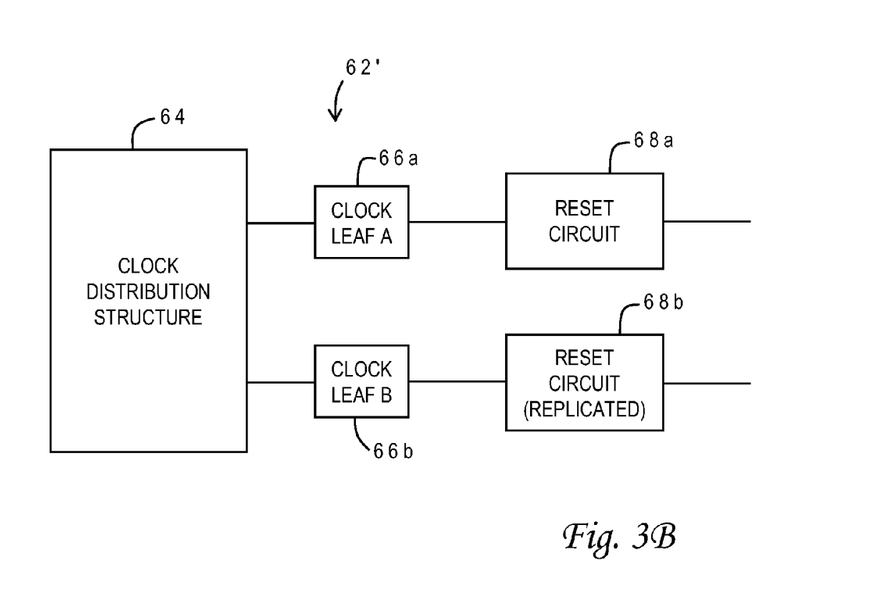

Construction of an exemplary design structure for a clock network in accordance with the implementation of FIG. 2 is further illustrated in FIGS. 3A and 3B. In FIG. 3A, clock network 62 includes a clock distribution structure 64 supplying a clock signal to a clock leaf 66 which passes the signal to two reset circuits 68a and 68b. Reset circuit 68b is a replicated circuit, that is, a redundant copy of the circuit which was added to the netlist. The functional components of the reset circuits are controlled (clocked) by the signal from clock leaf 66. Reset circuits 68a, 68b are used to generate a control signal that causes a reset (power-on reboot) in a data processing system. Standard clock assignment has resulted in the use of the single clock leaf 66 to provide the clock signal to both reset circuits 68a, 68b. However, the reset circuit is identified by an automated procedure as being sensitive and so the assignment of a single clock leaf to both reset circuits is considered a violation. The violation is fixed as shown in FIG. 3B by providing a modified clock network 62' which includes the clock distribution structure 64 but now has two clock leaves 66a, 66b (clock leaf A, clock leaf B), which respectively provide the clock signal to reset circuits 68a, 68b. Thus, a radiation event which causes an upset only in clock leaf A but not in clock leaf B can only affect reset circuit 68a and cannot affect reset circuit 68b, thereby imparting further radiation hardening.

Figure 4:
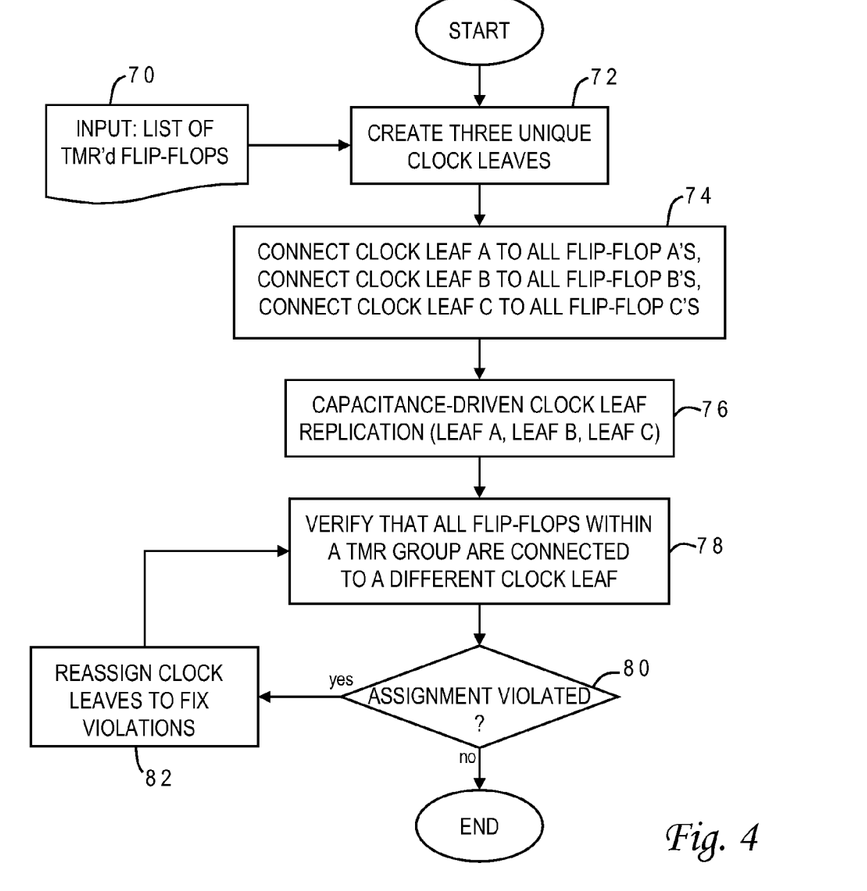
FIG. 4 is a flow chart depicting clock leaf assignments for triple modular redundancy (TMR) flip-flops to provide enhanced radiation tolerance in accordance with another implementation of the present invention.

Another exemplary implementation of the invention is directed to triple modular redundancy (TMR) circuits such as flip-flops which may be considered sensitive for radiation tolerance purposes. As seen in FIG. 4, this design process begins with a list of TMR flip-flop circuits (70). Each TMR circuit has three flip-flop legs, i.e., flip-flop A, flip-flop B, and flip-flop C. Three unique clock leaves are created (72) and connected respectively to legs of the TMR circuits, i.e., clock leaf A is connected to all flip-flops A in each TMR circuit, clock leaf B is connected to all flip-flops B in each TMR circuit, clock leaf C is connected to all flip-flops C in each TMR circuit (74). Capacitance-driven clock leaf replication (for each clock leaf A, B, C) is used for the logical-to-physical translation of the design structure (76). After capacitance-driven clock leaf replication, the process verifies that all three flip-flops within a given TMR circuit are still connected to different clock leaves (78), since the replication tool may switch clock leaf assignments as part of a physical placement optimization. A check is made to see whether any flip-flop clock leaf assignments are violations (80) and, if so, the clock leaves for the corresponding circuits are reassigned to fix the violation(s) (82). Once there are no more violations the process ends.

Figure 5:
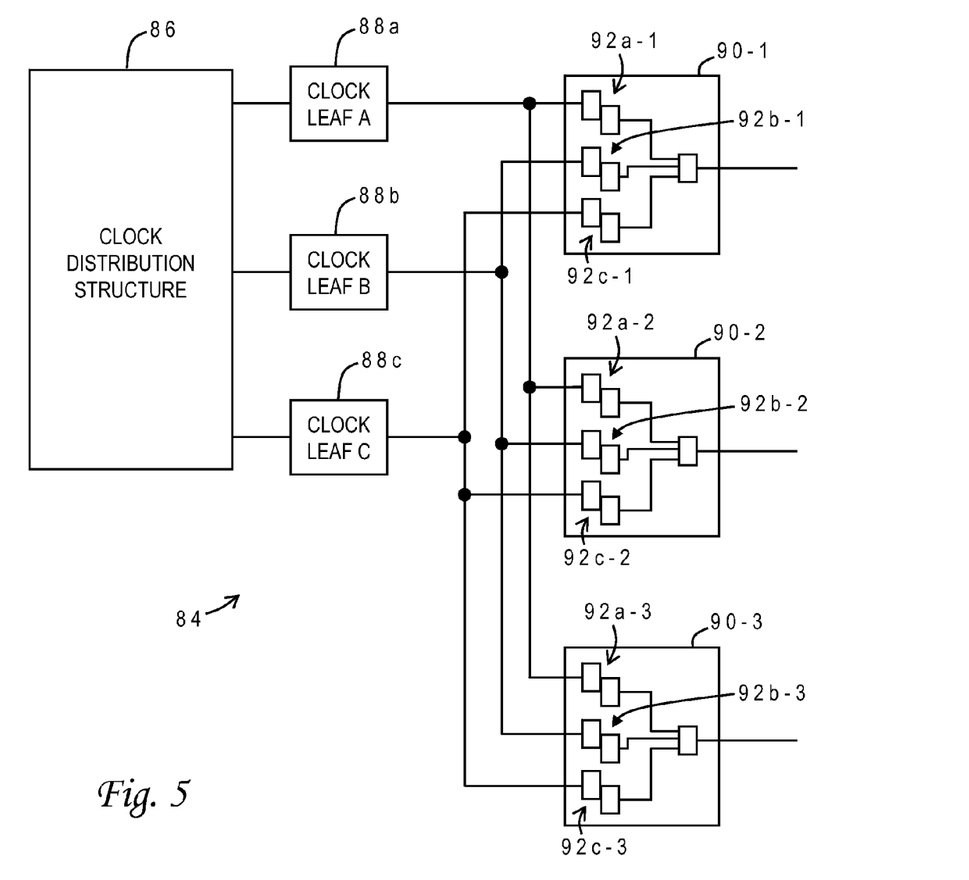
FIG. 5 is a high-level schematic diagram showing one example of TMR flip-flops whose legs have different clock leaf assignments in accordance with the implementation of FIG. 4.

An exemplary design structure for a clock network constructed in accordance with the implementation of FIG. 4 is further illustrated in FIG. 5. Clock network 84 includes a clock distribution structure 86 supplying a clock signal to three different clock leaves 88a, 88b, 88c (clock leaf A, clock leaf B, clock leaf C). These clock leaves provide clock signals to different legs of three TMR flip-flop circuits 90-1, 90-2, 90-3. Each TMR circuit has three legs, i.e., TMR circuit 90-1 includes legs 92a-1, 92b-1, and 92c-1, TMR circuit 90-2 includes legs 92a-2, 92b-2, and 92c-2, and TMR circuit 90-3 includes legs 92a-3, 92b-3, and 92c-3. Each leg is comprised of a master latch stage and a slave latch stage. The data outputs of the legs are inputs to respective majority voting circuits, i.e., legs 92a-1, 92b-1 and 92c-1 are connected to majority voting circuit 96-1, legs 92a-2, 92b-2 and 92c-2 are connected to majority voting circuit 96-2, and legs 92a-3, 92b-3 and 92c-3 are connected to majority voting circuit 96-3. The signal from clock leaf 88a controls legs 92a-1, 92a-2, and 92a-3, the signal from clock leaf 88b controls legs 92b-1, 92b-2, and 92b-3, and the signal from clock leaf 88c controls legs 92c-1, 92c-2, and 92c-3. Thus, a radiation event which causes an upset only in clock leaf A but not in clock leaves B or C can only affect one leg in a given TMR circuit, thereby imparting further radiation hardening.

Figure 6:
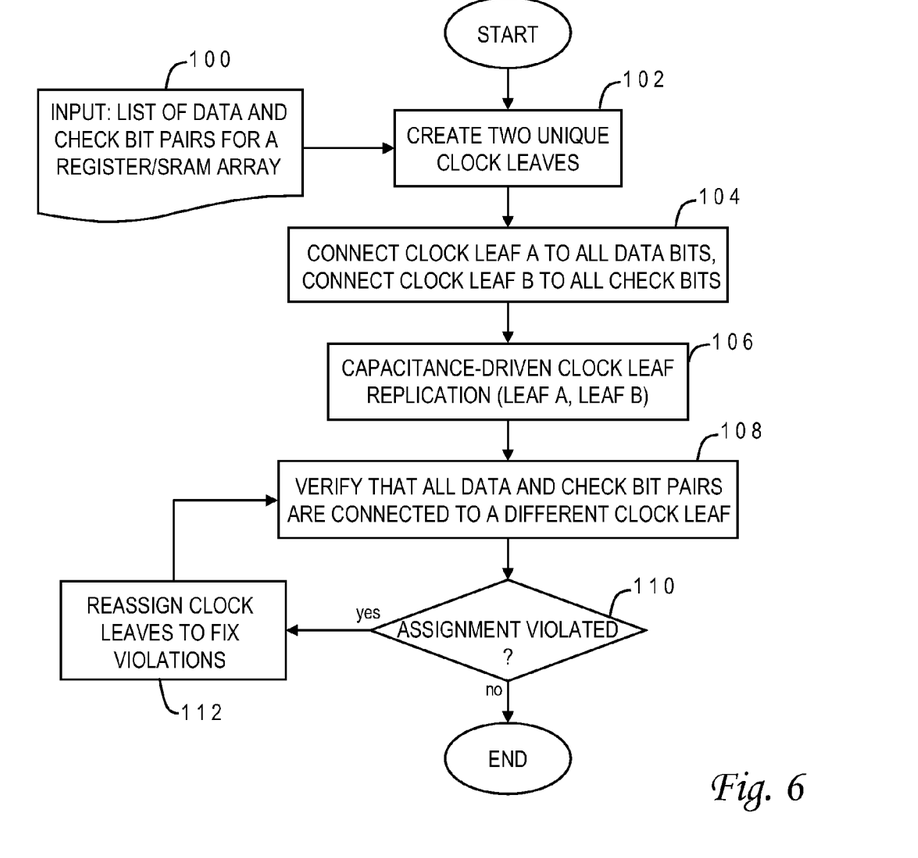
FIG. 6 is a flow chart illustrating clock leaf assignments for a storage array have data bits and error-correction check bits to provide enhanced radiation tolerance in accordance with one another implementation of the present invention.

Yet another exemplary implementation of the invention is directed to a data storage array which includes error-correcting code (ECC) check bits, wherein the storage array or a portion thereof may be considered sensitive for radiation tolerance purposes. The storage array may for example be a register for use with an execution unit of a processor such as a floating-point register, or a memory array such as a static, random-access (SRAM) array. Any ECC encoding scheme may be used to generate the check bits, e.g., single-bit correction, double-bit detection encoding. As seen in FIG. 6, this design process begins with a list of data and check bit pairs for which radiation protection is desired (100). Two unique clock leaves are created (102) and connected respectively to the data and check bits of the array, i.e., clock leaf A is connected to all listed data bits and clock leaf B is connected to all listed check bits (104). Capacitance-driven clock leaf replication (for each clock leaf A, B) is used for the logical-to-physical translation of the design structure (106). After capacitance-driven clock leaf replication, the process verifies that all data and check bits are still connected to their respective clock leaves (108), since the replication tool may switch clock leaf assignments as part of a physical placement optimization. A check is made to see whether any clock leaf assignments are violations (110) and, if so, the clock leaves for the corresponding circuits are reassigned to fix the violation(s) (112). Once there are no more violations the process ends.

Figure 7:
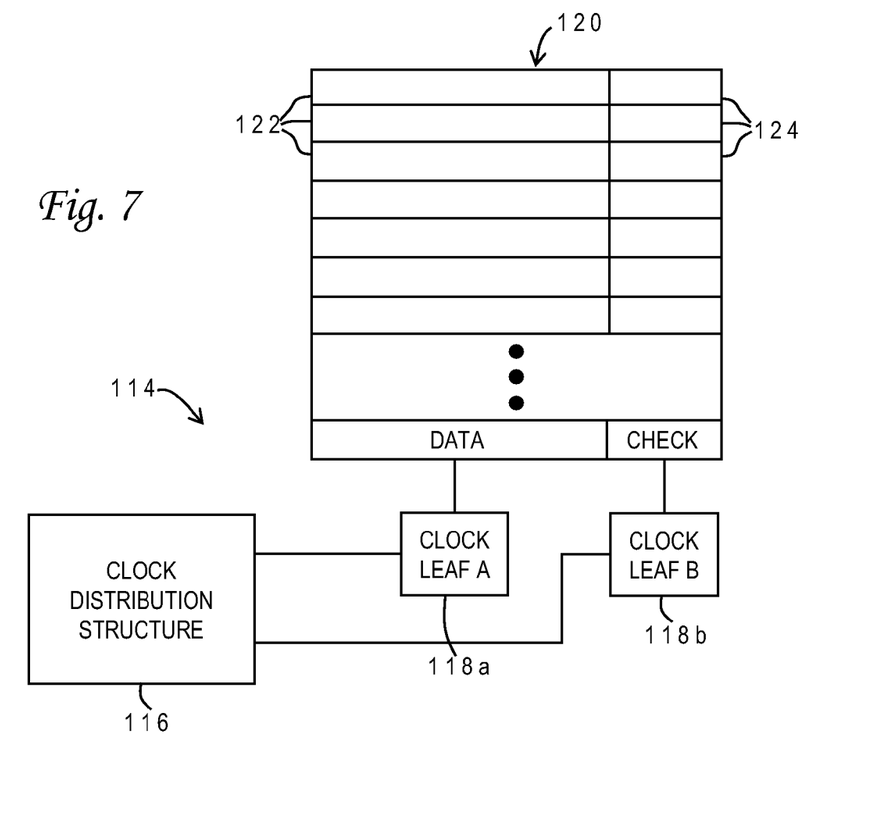
FIG. 7 is a high-level schematic diagram depicting one example of a storage array whose data and check bits have different clock leaf assignments in accordance with the implementation of FIG. 6.

An exemplary design structure for a clock network constructed in accordance with the implementation of FIG. 6 is further illustrated in FIG. 7. Clock network 114 includes a clock distribution structure 116 supplying a clock signal to two different clock leaves 118a, 118b (clock leaf A, clock leaf B). These clock leaves provide clock signals to different bits of a storage array 120 have a plurality of entries or lines wherein each entry has data bits and associated check bits, i.e., clock leaf 118a controls data bits 122, and clock leaf 118b controls check bits 124. Thus, a radiation event which causes an upset only in clock leaf A but not in clock leaf B can only affect the data bits 118 of a line and cannot affect the check bits 120 of the same line, thereby imparting further radiation hardening.

The present invention accordingly provides a significant improvement in the rate of soft-errors arising from upsets in the clock network of an integrated circuit. The use of clock signal interleaving is particularly advantageous in those circuit applications wherein hardening of the entire clock network may be infeasible due to, e.g., area or power overhead. The present invention may also advantageously be used in conjunction with existing designs, placement optimizations and automated methods. The method is usable for any type of integrated circuit, custom or application-specific (ASIC), but has particular applicability to circuits used in aerospace systems where there is increased radiation.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the invention has been described in the context of three specific examples, it can be seen from the varied nature of these examples that the clock signal interleaving principle can be applied more generally to any set of sensitive circuits that have some functional relationship in order to lessen the likelihood that the overall output of the circuits will be affected by an upset in the clock network. It is therefore contemplated that such modifications can be made without departing from the spirit or scope of the present invention as defined in the appended claims.

What is claimed is:

1. An automated method for designing an integrated circuit using a computer system, comprising:

receiving a circuit description which includes a plurality of circuits having a common clock domain with distinct clock signal terminations at multiple clock distribution nodes of the common clock domain by executing first instructions in the computer system;

identifying at least two functionally related circuits in the circuit description for which radiation tolerance is desired by executing second instructions in the computer system;

selectively assigning a first one of the at least two circuits to a first one of the clock distribution nodes by executing third instructions in the computer system;

selectively assigning a second one of the at least two circuits to a second one of the clock distribution nodes by executing fourth instructions in the computer system;

optimizing the circuit description for logical-to-physical translation after said assigning of the first and second clock distribution nodes by executing fifth instructions in the computer system;

determining that said optimizing has assigned the first and second circuits to a common one of the first and second clock distribution nodes by executing sixth instructions in the computer system;

in response to said determining, reassigning the first circuit to the first clock distribution node and reassigning the second circuit to the second clock distribution node by executing seventh instructions in the computer system; and storing the circuit description with clock distribution node assignments in a storage device of the computer system.

2. The method of claim 1 wherein the second circuit is a redundant replica of the first circuit.

3. The method of claim 1 wherein the first and second circuits are components of a modular redundant circuit.

4. The method of claim 1 wherein the first circuit includes a set of data bits for an entry of a storage array and the second circuit includes a set of check bits associated with the entry.

5. A computer system comprising:
one or more processors which process program instructions;
a memory device connected to said one or more processors; and
program instructions residing in said memory device for designing an integrated circuit by receiving a circuit description which includes a plurality of circuits having a common clock domain with distinct clock signal terminations at multiple clock distribution nodes of the common clock domain, identifying at least two functionally related circuits in the circuit description for which radiation tolerance is desired, selectively assigning a first one of the at least two circuits to a first one of the clock distribution nodes, selectively assigning a second one of the at least two circuits to a second one of the clock distribution nodes, optimizing the circuit description for logical-to-physical translation after assigning the first and second clock distribution nodes, determining that the optimizing has assigned the first and second circuits to a common one of the first and second clock distribution nodes, and responsively reassigning the first circuit to the first clock distribution node and reassigning the second circuit to the second clock distribution node.

6. The computer system of claim 5 wherein the second circuit is a redundant replica of the first circuit.

7. The computer system of claim 5 wherein the first and second circuits are components of a modular redundant circuit.

8. The computer system of claim 5 wherein the first circuit includes a set of data bits for an entry of a storage array and the second circuit includes a set of check bits associated with the entry.

9. A computer program product comprising:
a computer-readable storage medium; and
program instructions residing in said storage medium for designing an integrated circuit by receiving a circuit description which includes a plurality of circuits having a common clock domain with distinct clock signal terminations at multiple clock distribution nodes of the common clock domain, identifying at least two functionally related circuits in the circuit description for which radiation tolerance is desired, selectively assigning a first one of the at least two circuits to a first one of the clock distribution nodes, selectively assigning a second one of the at least two circuits to a second one of the clock distribution nodes, optimizing the circuit description for logical-to-physical translation after assigning the first and second clock distribution nodes, determining that the optimizing has assigned the first and second circuits to a common one of the first and second clock distribution nodes, and responsively reassigning the first circuit to the first clock distribution node and reassigning the second circuit to the second clock distribution node.

10. The computer program product of claim 9 wherein the second circuit is a redundant replica of the first circuit.

11. The computer program product of claim 9 wherein the first and second circuits are components of a modular redundant circuit.

12. The computer program product of claim 9 wherein the first circuit includes a set of data bits for an entry of a storage array and the second circuit includes a set of check bits associated with the entry.

13. A design structure used in the design of an integrated circuit, the design structure comprising:
a machine readable storage medium; and
a circuit description stored in said machine readable storage medium, said circuit description having a plurality of circuits including first and second functionally related circuits in a common clock domain which have been designated as sensitive to radiation, and a clock network for the common clock domain including a clock distribution structure connected to distinct first and second clock leaves, wherein said first clock leaf provides a clock signal to said first circuit and said second clock leaf provides the clock signal to said second circuit such that said circuit description may be used by an electronic design tool to carry out the physical design of the integrated circuit, said first circuit includes a set of data bits for an entry of a storage array and said second circuit includes a set of check bits associated with said entry.

14. The design structure of claim 13 wherein said second circuit is a redundant replica of said first circuit.

15. The design structure of claim 14 wherein said first and second circuits are reset circuits.

16. The design structure of claim 13 wherein said first and second circuits are components of a modular redundant circuit.

17. An automated method for designing an integrated circuit using a computer system, comprising:
receiving a circuit description which includes a plurality of circuits having a common clock domain with distinct clock signal terminations at multiple clock distribution nodes of the common clock domain by executing first instructions in the computer system;
identifying at least two functionally related circuits in the circuit description for which radiation tolerance is desired by executing second instructions in the computer system, wherein a first one of the at least two circuits includes a set of data bits for an entry of a storage array and a second one of the at least two circuits includes a set of check bits associated with the entry;
selectively assigning the first circuit to a first one of the clock distribution nodes by executing third instructions in the computer system;
selectively assigning the second circuit to a second one of the clock distribution nodes by executing fourth instructions in the computer system; and
storing the circuit description with clock distribution node assignments in a storage device of the computer system.

18. A computer system comprising:
one or more processors which process program instructions;
a memory device connected to said one or more processors; and
program instructions residing in said memory device for designing an integrated circuit by receiving a circuit description which includes a plurality of circuits having a common clock domain with distinct clock signal terminations at multiple clock distribution nodes of the common clock domain, identifying at least two functionally related circuits in the circuit description for which radiation tolerance is desired wherein a first one of the at least two circuits includes a set of data bits for an entry of a storage array and a second one of the at least two circuits includes a set of check bits associated with the entry, selectively assigning the first circuit to a first one of the clock distribution nodes, and selectively assigning the second circuit to a second one of the clock distribution nodes.

19. A computer program product comprising:

a computer-readable storage medium; and program instructions residing in said storage medium for designing an integrated circuit by receiving a circuit description which includes a plurality of circuits having a common clock domain with distinct clock signal terminations at multiple clock distribution nodes of the common clock domain, identifying at least two functionally related circuits in the circuit description for which radiation tolerance is desired wherein a first one of the at least two circuits includes a set of data bits for an entry of a storage array and a second one of the at least two circuits includes a set of check bits associated with the entry, selectively assigning the first circuit to a first one of the clock distribution nodes, and selectively assigning the second circuit to a second one of the clock distribution nodes.

* * * * *